(12) United States Patent
Wu

(10) Patent No.: US 11,469,140 B2
(45) Date of Patent: Oct. 11, 2022

(54) SEMICONDUCTOR DEVICE HAVING A LANDING PAD WITH SPACERS AND METHOD FOR FABRICATING THE SAME

(71) Applicant: NANYA TECHNOLOGY CORPORATION, New Taipei (TW)

(72) Inventor: Chih-Tsung Wu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/002,278

(22) Filed: Aug. 25, 2020

(65) Prior Publication Data

US 2022/0068711 A1 Mar. 3, 2022

(51) Int. Cl.
*H01L 21/768* (2006.01)
*H01L 23/535* (2006.01)
*H01L 27/108* (2006.01)

(52) U.S. Cl.
CPC .... *H01L 21/76897* (2013.01); *H01L 21/7684* (2013.01); *H01L 21/76805* (2013.01); *H01L 21/76895* (2013.01); *H01L 23/535* (2013.01); *H01L 27/10814* (2013.01)

(58) Field of Classification Search
CPC ......... H01L 21/76897; H01L 21/76805; H01L 21/7684; H01L 21/76895; H01L 23/535; H01L 27/10814
See application file for complete search history.

(56) References Cited

U.S. PATENT DOCUMENTS

| 2002/0135004 | A1 | 9/2002 | Uh et al. |
| 2010/0102374 | A1 | 4/2010 | Wu |
| 2010/0258907 | A1* | 10/2010 | Tomoyama ............. H01L 28/91 |
| | | | 257/E21.012 |
| 2018/0301457 | A1* | 10/2018 | Lee .......................... H01L 28/91 |

FOREIGN PATENT DOCUMENTS

GB 2349015 * 10/2000 ....... H01L 27/10852

* cited by examiner

*Primary Examiner* — Shahed Ahmed
*Assistant Examiner* — Vicki B. Booker
(74) *Attorney, Agent, or Firm* — Muncy, Geissler, Olds & Lowe, P.C.

(57) ABSTRACT

The present application discloses a semiconductor device having a landing pad with spacers and a method for fabricating the semiconductor device. The semiconductor device includes a first insulating layer, a second insulating layer, a conductive pillar and spacers. The first insulating layer is disposed on a substrate. The second insulating layer is disposed on the first insulating layer. The conductive pillars are disposed in the first insulating layer and penetrates through the second insulating layer. The spacers are disposed on sidewalls of the conductive pillars.

15 Claims, 20 Drawing Sheets

SEMICONDUCTOR DEVICE HAVING A LANDING PAD WITH SPACERS AND METHOD FOR FABRICATING THE SAME

TECHNICAL FIELD

The present disclosure relates to a semiconductor device having a landing pad with spacers and a method for fabricating the same, and more particularly, to a landing pad including at least one self-aligned selective growth pillar and spacers disposed on sidewalls of the self-aligned selective growth pillar.

DISCUSSION OF THE BACKGROUND

The semiconductor industry faces many challenges in the pursuit of device miniaturization which involves rapid scaling of nanoscale features. Such issues include the introduction of complex fabrication steps such as multiple lithography steps and integration of high performance materials. To maintain the cadence of device miniaturization, selective deposition has shown promise as it has the potential to remove costly lithographic steps by simplifying integration schemes.

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor.

Self-aligned metal oxide pillars can be formed through the oxidation of gap-filled metal films. Metal is deposited on the structure of holes or trenches and then oxidized to form metal oxides. The volume expansion during oxidization pushes a pillar out of the holes or trenches. The pillars are selectively grown from the bottom-up from metal only.

In conventional DRAM having a capacitor over bitline ("COB") structure, with the decrease of a dimension of a buried contact ("BC") and an increase in the aspect ratio, a technique has been proposed for forming a stable BC by using a landing pad without performing the etching process of the BC to secure an alignment margin for the photolithography. In general, the technique uses a single process to simultaneously form a bit line landing pad for a connection to the bit line and a storage node landing pad for a connection to the storage node. This diminishes the required etching depth in the etching process at the time of forming the BC and secures the desired alignment margin in the etching process.

However, a gap between the landing pads diminishes to approximately 0.1 mm according to a further limitation of the design rule resulting from the increase of the degree of integration. This makes it substantially difficult to restrain the occurrence of a stringer or a bridge phenomenon. In order to restrain the stringer and the bridge phenomenon resulting from the limitation of the design rule, a method has been proposed in which only the landing pad for the bit line is chiefly formed and a BC for the storage node is directly connected to the active region of a semiconductor substrate by self-aligning.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first insulating layer disposed on a substrate, a second insulating layer, a conductive pillar and spacers. The second insulating layer is disposed above the first insulating layer. The conductive pillar is disposed in the first insulating layer and penetrates through the second insulating layer. The spacers are disposed on sidewalls of the conductive pillar.

In some embodiments, the semiconductor device further comprises a conductive line disposed in the first insulating layer and located below the conductive pillar.

In some embodiments, a top surface of the conductive line is lower than a surface of the substrate.

In some embodiments, the substrate comprises a semiconductor material.

In some embodiments, the spacers are made of a conductive material.

Another aspect of the present disclosure provides a method for fabricating a semiconductor device including forming a first insulating layer on a substrate; forming a plurality of recesses in the first insulating layer; forming a conductive line in the at least one recess; forming a self-aligned selective growth pillar over the conductive line; selective forming spacers on sidewalls of the self-aligned selective growth pillars; depositing a second insulating layer to overfill gaps between the two adjacent self-aligned selective growth pillars; removing the second insulating layer over the self-aligned selective growth pillars; removing the self-aligned selective growth pillars to form trenches; and depositing a conductive material in the trenches.

In some embodiments, the step of forming a plurality of recesses in the first insulating layer is performed by an etching process.

In some embodiments, the step of forming a conductive line in the at least one recess, further comprising: depositing a conductive layer in the trenches; planarizing the conductive layer to a surface of the substrate; and recessing the conductive layer to be lower than the surface of the first insulating layer to form the conductive line.

In some embodiments, in the step of forming the self-aligned selective growth pillar over the conductive line, a top of the self-aligned selective growth pillar is higher than the surface of the first insulating layer.

In some embodiments, a height between the top of the self-aligned selective growth pillar and the surface of the first insulating layer is in an approximate range from about 5 angstroms to about 10 microns.

In some embodiments, the method for fabricating the semiconductor device further comprises exposing the first insulating layer to a carbon precursor before the step of forming the self-aligned selective growth pillar over the conductive line.

In some embodiments, the step of selective forming spacers on sidewalls of the self-aligned selective growth pillars, further comprises: depositing a conductive layer on the surface of the first insulating layer, the top of the self-aligned selective growth pillar and sidewalls of the self-aligned selective growth pillar; and removing the conductive layer on the surface of the first insulating layer and the top of the self-aligned selective growth pillar.

In some embodiments, the step of removing the conductive layer on the surface of the first insulating layer and the top of the self-aligned selective growth pillar is performed by a spacer etching process.

In some embodiments, the self-aligned selective growth pillars are separated by the gaps after the step of selective forming spacers on sidewalls of the self-aligned selective growth pillars.

In some embodiments, the step of removing the insulating layer over the self-aligned selective growth pillars is performed by chemical-mechanical planarization.

In some embodiments, a top of the second insulating layer is even with or slightly below the top of the self-aligned selective growth pillar after the step of removing the second insulating layer over the self-aligned selective growth pillars.

In some embodiments, the step of removing the self-aligned selective growth pillars to form trenches is performed by an etching process.

In some embodiments, the etching process is one or more of a dry etch or wet etch.

In some embodiments, the self-aligned selective growth pillars extend substantially orthogonally from top surfaces of the recessed conductive lines.

In some embodiments, the method for fabricating the semiconductor device further comprises planarizing the conductive material to a top of the second insulating layer to form a conductive pillar after the step of depositing the conductive material in the trenches.

Due to the design of the semiconductor device of the present disclosure, a landing pad (the conductive pillar) is formed with the conductive spacers. Therefore, the stringer and the bridge phenomenon resulting from the limitation of the design rule may be restrained.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
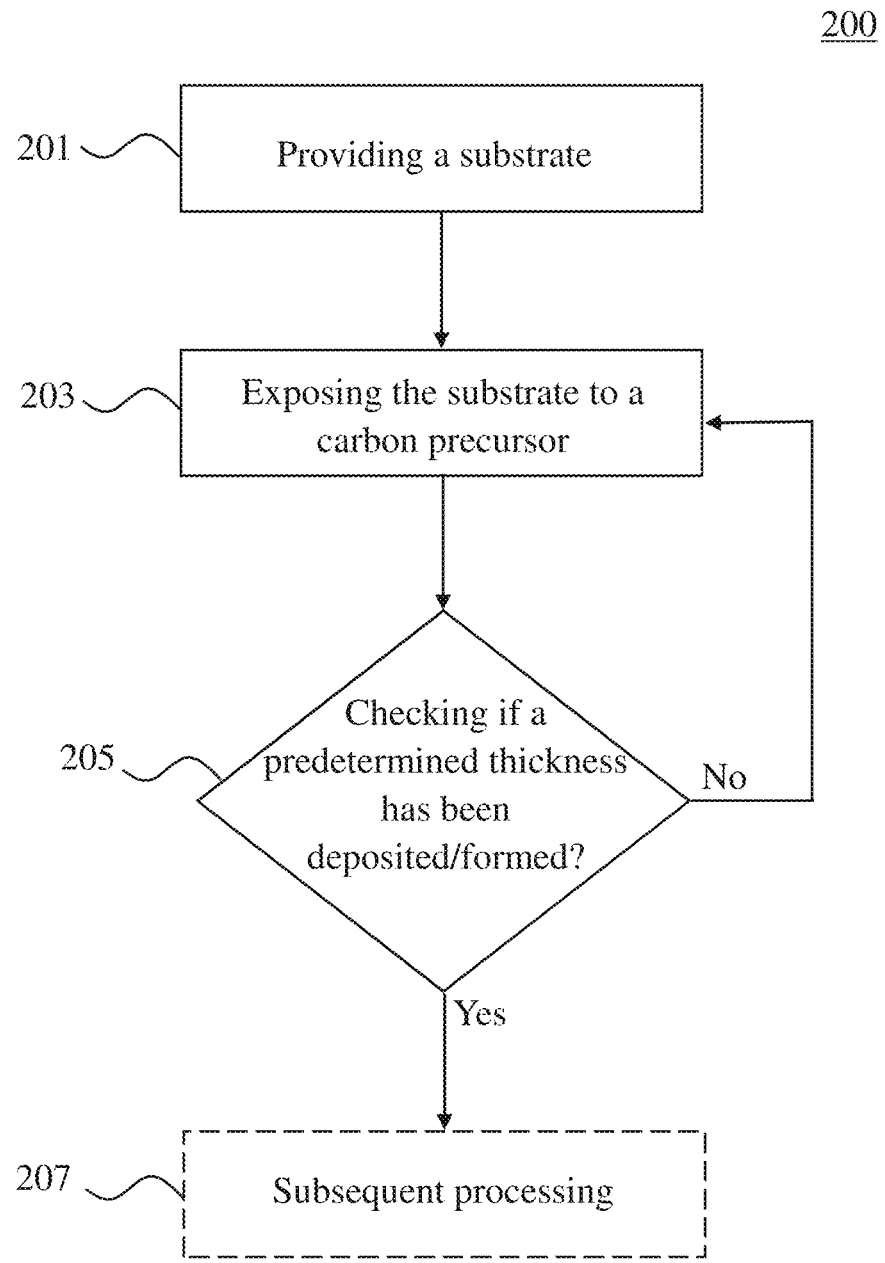
FIG. 1 is a method for selectively depositing a carbon film or forming a carbon pillar according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer may also be described as the substrate surface. The composition of a given substrate surface will depend on the materials to be deposited, as well as the particular chemistry used.

As used in this specification and the appended claims, the terms "precursor", "reactant", "reactive gas" and the like are used interchangeably to refer to any gaseous species that can react with the substrate surface.

Some embodiments of the disclosure provide methods for selectively depositing a carbon film. In some embodiments, the carbon film is selectively deposited on a metal-containing surface over a different surface. As used in this specification and the appended claims, the phrase "selectively depositing a film on one surface over another surface", and the like, means that a first amount of the film is deposited on the first surface and a second amount of film is deposited on the second surface, where the second amount of film is less than the first amount of film, or no film is deposited on the second surface.

The term "over" used in this regard does not imply a physical orientation of one surface on top of another surface, rather a relationship of the thermodynamic or kinetic properties of the chemical reaction with one surface relative to the other surface. For example, selectively depositing a carbon film onto a metal surface over a dielectric surface means that the carbon film deposits on the metal surface and less or no carbon film deposits on the dielectric surface; or that the formation of a carbon film on the metal surface is thermodynamically or kinetically favorable relative to the formation of a carbon film on the dielectric surface.

Some embodiments of the disclosure advantageously provide methods for selectively depositing a carbon film on a first surface over a second surface. Some embodiments of the disclosure provide methods for depositing a carbon film which are performed at relatively low temperatures. Some embodiments of the disclosure advantageously provide methods of depositing a carbon film without the use of plasma reactants or treatments. In some embodiments, the first surface comprises a metal and the second surface comprises a dielectric material.

Figure 2:
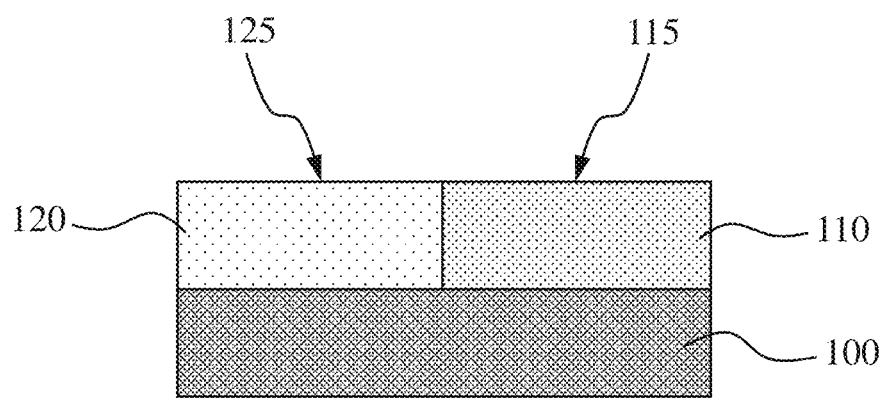
FIG. 2 is an exemplary substrate for selectively depositing a carbon film according to some embodiments.

Referring to the Figures, FIG. 2 shows an exemplary substrate 100 in accordance with one or more embodiment of the disclosure. The substrate 100 comprises a first material 110 and a second material 120. The first material 110 has an exposed first material surface 115. The second material 120 has an exposed second material surface 125.

The first material 110 comprises a metal. In some embodiments, the metal comprises or consists essentially of one or more of Ti, Co, Ni, Cu, Ru, Rh, Pd, Ag, Hf, Ta, W, Re, Ir, Pt, or Au. In some embodiments, the metal comprises or consists essentially of one or more of Ti, Hf, Ta, or W. In some embodiments, the metal comprises or consists essentially of one or more of Co, Ni, Ru, Rh, Pd, or Re. In some embodiments, the metal comprises or consists essentially of one or more of Cu, Pd, Ag, Ir, Pt, or Au. As used in this specification and the appended claims, the term "consists essentially of", and the like, means that the subject material or composition is greater than or equal to about 95%, 98%, 99% or 99.5% of the stated material.

In some embodiments, the first material 110 comprises a substantially pure metal or metal alloy. Stated differently, the first material 110 may consist essentially of metal atoms. In some embodiments, the first material 110 comprises metallic elements and non-metallic elements. In some embodiments, the first material 110 comprises a metal nitride, metal carbide, metal silicide, metal oxide, metal sulfide, metal selenide, metal telluride or combinations thereof.

In some embodiments, the second material 120 comprises a dielectric material. In some embodiments, the second material 120 comprises silicon.

FIG. 1 illustrates a method for forming a carbon film on a substrate 100 in accordance with one or more embodiment of the disclosure. The method 200 generally begins at step 202, where a substrate upon which a carbon film is to be formed is provided. As used in this regard, the term "provided" means that the substrate is placed into a position or environment for further processing.

Figure 3:
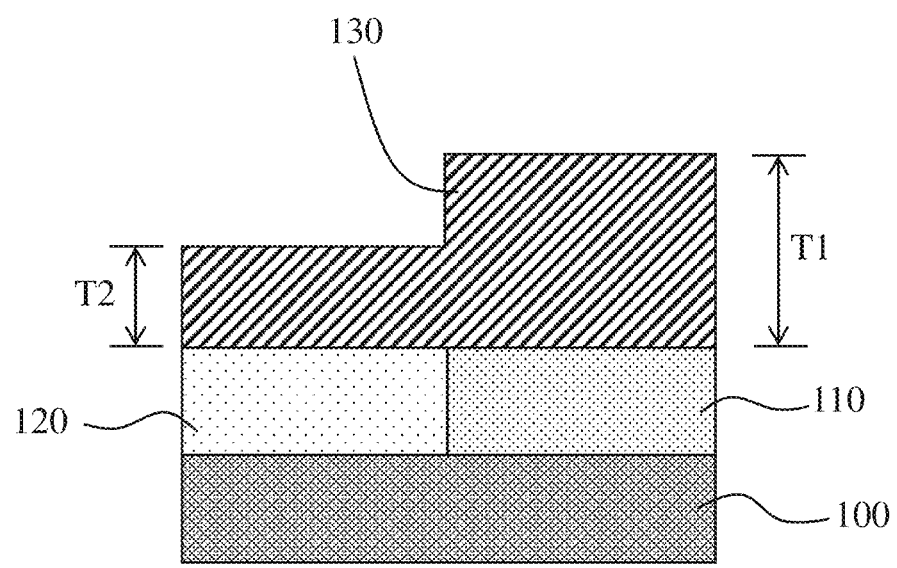
FIG. 3 is an exemplary substrate with a carbon film selectively deposited thereon according to some embodiments.

At step 204, a carbon film is formed on the substrate 100. The carbon film may be formed via a chemical vapor deposition process (CVD), or the like. Referring also to FIG. 3, at step 204, the substrate 100 is exposed to a carbon precursor to form a carbon film 130 with a first thickness T1 on the exposed first material surface 115 and a second thickness T2 on the exposed second material surface 125. The first thickness T1 is greater than the second thickness T2. For the sake of understanding, the second thickness T2 is illustrated in FIG. 3. In some embodiments, the second thickness T2 is minimal or none.

The selectivity of a deposition process is generally expressed as a multiple of growth rate. For example, if a film is grown on one surface 25 times faster than on a different surface, the process would be described as having a selectivity of 25:1. In this regard, higher ratios indicate more selective processes. In some embodiments, the method has a selectivity of greater than or equal to about 10:1, greater than or equal to about 25:1, greater than or equal to about 50:1, or greater than or equal to about 100:1.

The carbon precursor may comprise any suitable carbon-containing species. In some embodiments, the carbon precursor consists essentially of carbon and hydrogen atoms. In some embodiments, the carbon precursor comprises a C1-C4 hydrocarbon, a C1-C6 hydrocarbon or a C1-C8 hydrocarbon. As used in this regard, C1-C4, and the like, refers to a species with a number of carbon atoms in a range of 1 to 4. In some embodiments, the carbon precursor comprises at least one unsaturated bond. In some embodiments, the carbon precursor comprises or consists essentially of one or more of $C_2H_2$, $C_2H_4$, $C_3H_6$, or $CH_4$. For gaseous compositions, the term "consists essentially of" refers to the active component of the composition, not including diluent, carrier or inert gases.

In some embodiments, the substrate is exposed to a carbon precursor comprising an additional reactant or diluent. In some embodiments, the additional reactant or diluent comprises or consists essentially of hydrogen gas ($H_2$), nitrogen gas ($N_2$) or argon gas (Ar). In some embodiments, when provided as part of the carbon precursor, hydrogen gas ($H_2$) is not provided as diluent, carrier or inert gasses.

The flow rate of the carbon precursor can be any suitable flow rate including, but not limited to, flow rates is in the range of about 1 to about 5000 sccm, or in the range of about 2 to about 4000 sccm, or in the range of about 3 to about 3000 sccm, or in the range of about 5 to about 2000 sccm, or in the range of about 10 to about 2000 sccm.

The carbon precursor can be provided so as to establish any suitable pressure around the substrate (i.e. within a processing chamber) including, but not limited to, a pressure in the range of about 1 Torr to about 3000 Torr, or in the range of about 2 Torr to about 1500 Torr, or in the range of about 100 Torr to about 1000 Torr, or in the range of about 500 Torr to about 1000 Torr. In some embodiments, the substrate is exposed to the carbon precursor at about atmospheric pressure (e.g. 760 Torr).

The temperature of the substrate during deposition can be controlled, for example, by setting the temperature of a substrate support. In some embodiments the substrate is held at a temperature in the range of about 100° C. to about 700° C., or in the range of about 100° C. to about 500° C., or in the range of about 300° C. to about 500° C. In some embodiments, the substrate is maintained at a temperature less than or equal to about 700° C., less than or equal to about 500° C. or less than or equal to about 300° C.

The period of time that the substrate is exposed to the carbon precursor gas may be any suitable amount of time necessary to allow a predetermined thickness of carbon film to form on the exposed first material surface. For example, the substrate may be exposed to the carbon precursor for a period of about 10 minutes to about 5 hours, or a period of about 30 minutes to about 3 hours or a period of about 1 hour to about 2 hours.

In some embodiments, the carbon film is formed at a rate of greater than or equal to about 20 nm/hour, greater than or equal to 25 nm/hour, greater than or equal to about 30 nm/hour, greater than or equal to about 40 nm/hour, or greater than or equal to about 50 nm/hour. In some embodiments, the carbon film is formed at a rate in a range of about 25 nm/hour to about 50 nm/hour.

In some embodiments, method of selectively depositing the carbon film is performed as a thermal process without the use of plasma reactants. Stated differently, in some embodiments, the method is performed without plasma.

Next, at step 206, it is determined whether the metal film has achieved a predetermined thickness. If the predetermined thickness has not been achieved, the method 200 returns to step 204 to continue forming the metal film until the predetermined thickness is reached. Once the predetermined thickness has been reached, the method 200 can either end or proceed to step 208 for optional subsequent processing.

Some embodiments of the disclosure provide methods for forming a carbon pillar. In some embodiments, the carbon pillar is selectively formed on a metal-containing surface over a different surface.

Some embodiments of the disclosure advantageously provide methods for forming a carbon pillar on a first surface over a second surface. Some embodiments of the disclosure provide methods for forming a carbon pillar which are performed at relatively low temperatures. Some embodiments of the disclosure advantageously provide methods of forming a carbon pillar without the use of plasma reactants or treatments. Some embodiments of the disclosure provide methods of forming a carbon pillar which provide a pillar without a "mushroom" effect. In some embodiments, the first surface comprises a metal and the second surface comprises a dielectric material.

Figure 4:
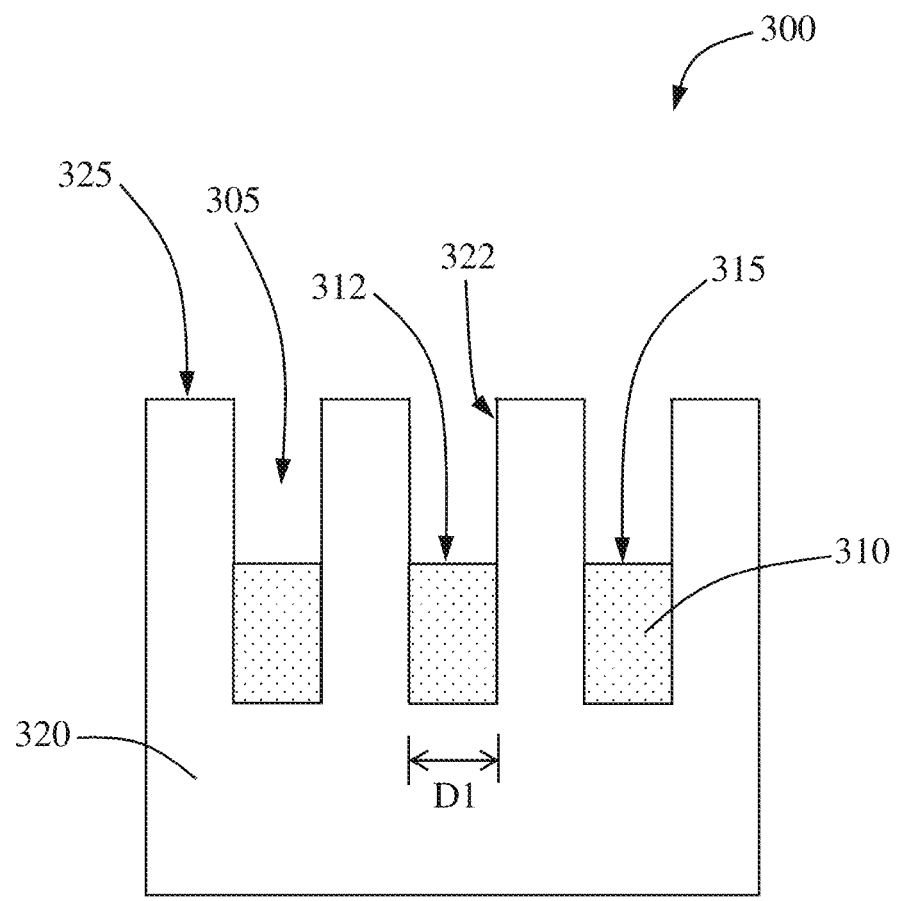
FIG. 4 is an exemplary substrate for forming a carbon pillar according to some embodiments.

Referring to the Figures, FIG. 4 shows an exemplary substrate 300 in accordance with one or more embodiment of the disclosure. The substrate 300 comprises a first material 310 and a second material 320. The first material 310 has an exposed first surface 315 with a first material dimension D1. The second material 320 has an exposed second surface 325. The exposed first surface 315 and the exposed second surface 325 form the substrate surface. In some embodiments, the first material 310 comprises a metal-containing material. In some embodiments, the second material 320 comprises a dielectric material. Accordingly, the first material 310 may be referred to as the first metal-containing material, and the second material 320 may be referred to as the second dielectric material.

The first material 310 comprises a metal. In some embodiments, the metal comprises or consists essentially of one or more of Co, Ni, Ru, Rh, Pd, or Re. Without being bound by theory, the inventors have found that these metal both catalyze the deposition of carbon and have a high level of carbon solubility. These factors combine to allow for a deposition method from a vapor precursor to a dissolved carbon species to solid precipitated carbon pillar. Without being bound by theory, it is believed that this mechanism provides for orthogonal growth rather than mushrooming of the carbon pillars.

In some embodiments, the first material 310 comprises a substantially pure metal or metal alloy. Stated differently, the first material 310 may consist essentially of metal atoms. In some embodiments, the first material 310 comprises metallic elements and non-metallic elements. In some embodiments, the first material 310 comprises a metal nitride, metal carbide, metal silicide, metal oxide, metal sulfide, metal selenide, metal telluride or combinations thereof.

In some embodiments, the second material 320 comprises a dielectric material. In some embodiments, the second material 320 comprises silicon.

In some embodiments, as shown in FIG. 4, the exposed first surface 315 is recessed from the exposed second surface 325 to form a substrate feature 305. The substrate feature 305 comprises at least one sidewall 322 of the second material 320 and a bottom 312 of the exposed first surface 315.

Alternatively, in some embodiments, the substrate 300 does not contain a feature 305 as shown in FIG. 4. For these embodiments the substrate 300 may appear as substrate 100 in FIG. 2. Stated differently, in some embodiments, the exposed first surface is substantially coplanar with the exposed second surface. As used in this specification and the appended claims, the term "substantially coplanar" means that the exposed first surface and the exposed second surface are coplanar within ±2 nm.

The method for forming the carbon pillar is similar to the method for forming the carbon film shown in FIG. 1. The method 200 generally begins at step 202, where a substrate upon which a carbon pillar is to be formed is provided.

Figure 5:
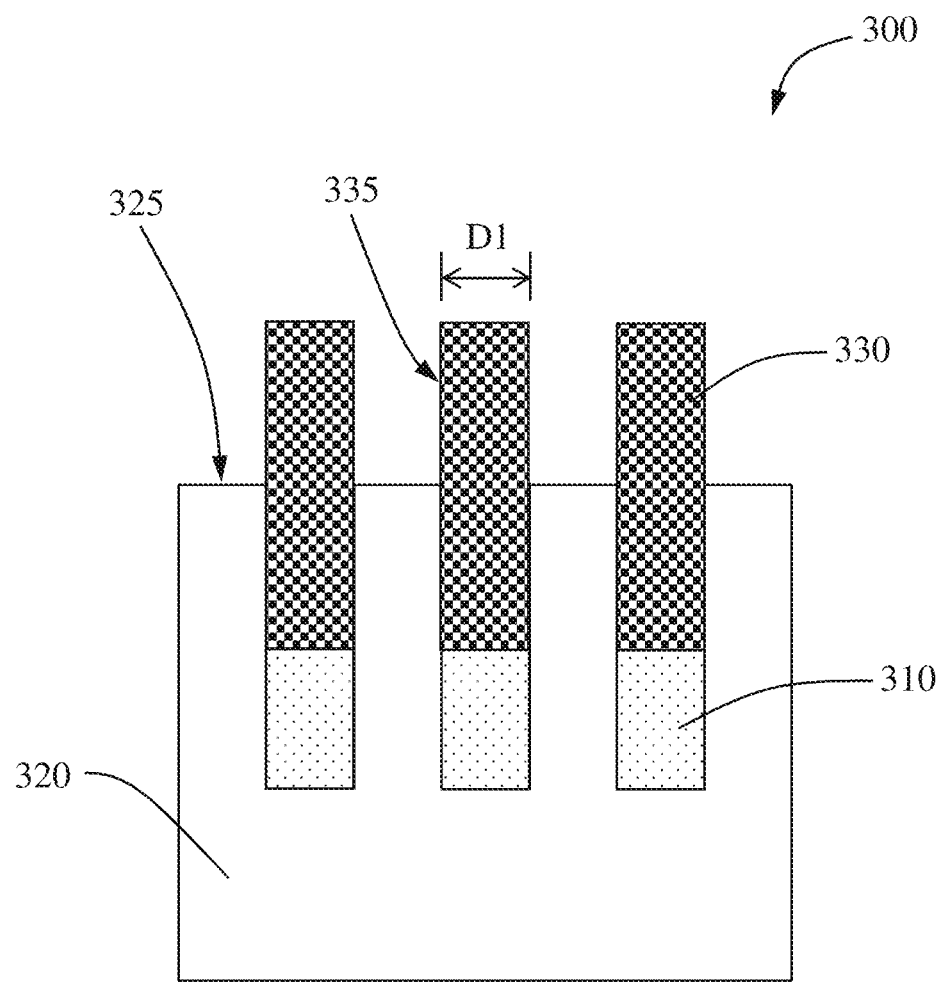
FIG. 5 is an exemplary substrate with a carbon pillar formed thereon according to some embodiments.

At step 204, a carbon pillar is formed on the substrate. The carbon pillar may be formed via a chemical vapor deposition process (CVD), or the like. Referring also to FIG. 5, at step 204, the substrate 300 is exposed to a carbon precursor to form a carbon pillar 330 comprising a carbon material. The carbon pillar 330 extends above the exposed second surface 325. The carbon pillar 330 has substantially the same first dimension D1 as the exposed first surface 315. In some embodiments, substantially no carbon material is deposited on the exposed second surface 325.

In some embodiments, the carbon pillar 330 has sides 335 which are substantially orthogonal to the substrate surface. In some embodiments, the carbon pillar 330 has sides 335 which are substantially orthogonal to the exposed second surface 325. As used in this regard, two surfaces may be described as substantially orthogonal when the angle formed at the junction of the surfaces is 90° C.±10° C.

The reactants and process parameters described above for the selective deposition of a carbon film are the same reactants and process parameters for the formation of the carbon pillar.

Next, at step 206, it is determined whether the carbon pillar has achieved a predetermined thickness. If the predetermined thickness has not been achieved, the method 200 returns to step 204 to continue forming the carbon pillar until the predetermined thickness is reached. Once the predetermined thickness has been reached, the method 200 can either end or proceed to step 208 for optional subsequent processing.

Some embodiments of the disclosure provide methods to form fully self-aligned vias. In one embodiment, a first metallization layer comprising a set of first conductive lines extending along a first direction on a first insulating layer on a substrate is formed. A second insulating layer is formed on the first insulating layer. A second metallization layer comprising a set of second conductive lines on a third insulating layer above the first metallization layer is formed. The set of second conductive lines extend along a second direction. A via is formed between the first metallization layer and the second metallization layer. The via is self-aligned along the second direction to one of the first conductive lines. The via is self-aligned along the first direction to one of the second conductive lines, as described in further detail below. In one embodiment, the first and second directions cross each other at an angle. In one embodiment, the first direction and second direction are substantially orthogonal to each other.

In one embodiment, a fully self-aligned via is fabricated using a selective pillar deposition technique. In one embodiment, the conductive lines on a first insulating layer on a substrate are recessed. The conductive lines extend along a first direction on the first insulating layer. Pillars are formed on the recessed conductive lines. A second insulating layer is deposited between the pillars. The pillars are removed to form trenches. An insulating layer is deposited to overfill gaps between the two adjacent self-aligned selective growth pillars. The insulating layer over the self-aligned selective growth pillars are removed. The self-aligned selective growth pillars are removed to form trenches. A conductive material is deposited in the trenches, as described in further detail below.

In one embodiment, a fully self-aligned via is a via that is self-aligned along at least two directions to the conductive lines in a lower and an upper metallization layers. In one embodiment, the fully self-aligned via is defined by a hard mask in one direction and the underlying insulating layer in another direction, as described in further detail below.

One or more embodiments provide fully self-aligned vias that advantageously eliminate the via misalignment issues and avoid shorting to the wrong metal line. The fully self-aligned vias provide lower via resistance and capacitance benefits over the conventional vias. Embodiments of the self-aligned vias provide full alignment between the vias and the conductive lines of the metallization layers that is substantially error free that advantageously increase the device yield and reduce the device cost.

When vias are printed close together—closer than the minimum pitch that can be obtained by lithography—the via mask layer set are split into multiple masks. For example, instead of defining via to metal in a single litho-etch sequence, two or more litho-etch sequences are used to avoid shorting the closely spaced vias. Some embodiments of the disclosure are directed to pillar growth processes in which all vias are defined as the cross-over between two metal layers so that adjacent vias will not short to each other. In some embodiments, multiple vias can be defined using one large lithography feature placed over multiple cross points. In this case, all areas where the metal layers overlap under the defined large lithography opening will form a via.

Further, the disclosed methods advantageously provide pillar which are easier to remove than metal oxide pillars. In some embodiments, the carbon pillars are removed by a dry etch process. Without being bound by theory, it is believed that the dry etch processes utilized to remove the carbon pillars are easier to perform than oxygen based ashing processes typically utilized to etch metal oxide materials.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

One or more embodiments of the disclosure are directed to methods and apparatus to provide fully self-aligned vias. The various aspects of the disclosure are described with respect to a detailed process illustrated in the Figures. Those skilled in the art will understand that the scope of the disclosure is not limited to the particular details described in the Figures and that some portions of the process can be altered or omitted.

Figure 6:
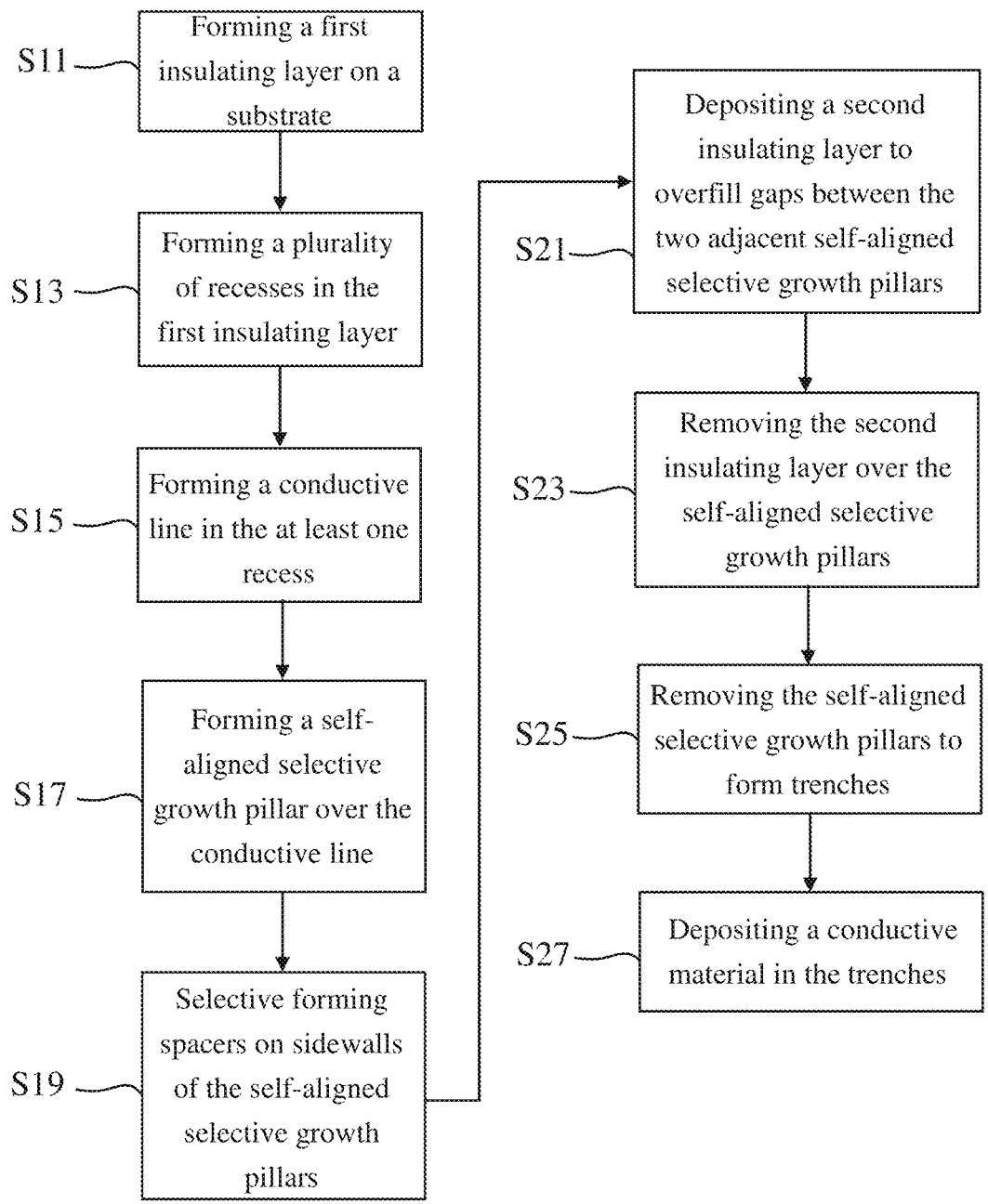
FIG. 6 is a flow chart of a method for fabricating a semiconductor device in accordance with one embodiment of the present disclosure.

FIG. 6 is a flow chart of a method 10 for fabricating a semiconductor device in accordance with one embodiment of the present disclosure; wherein the method 10 includes steps S11, S13, S15, S17, S19, S21, S23, S25 and S27, in accordance with some embodiments. The steps S11 to S27 of FIG. 6 are described in connection with following figures.

Figure 8:
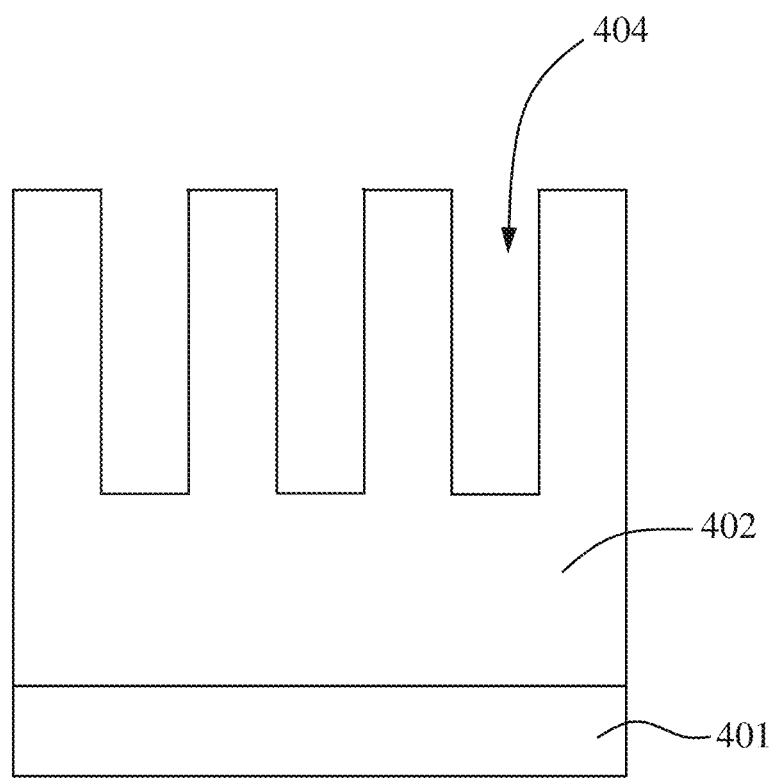
FIG. 8 is a cross sectional view of the substrate of the semiconductor device to provide a fully self-aligned via according to some embodiments.
Figure 9:
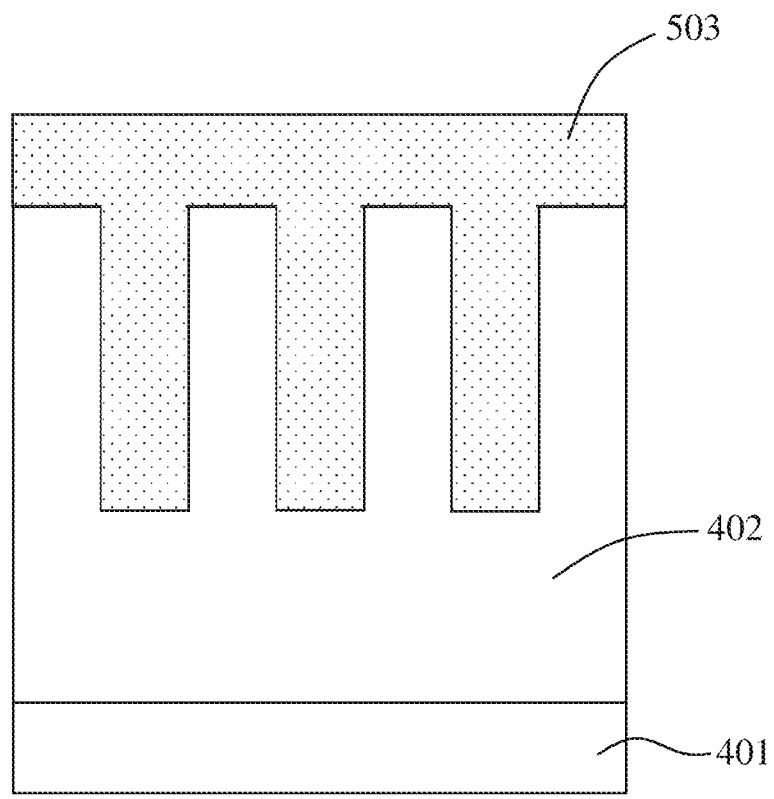
FIG. 9 is a cross sectional view of the substrate of the semiconductor device of FIG. 8 after a conductive material is deposited according to some embodiments.
Figure 10:
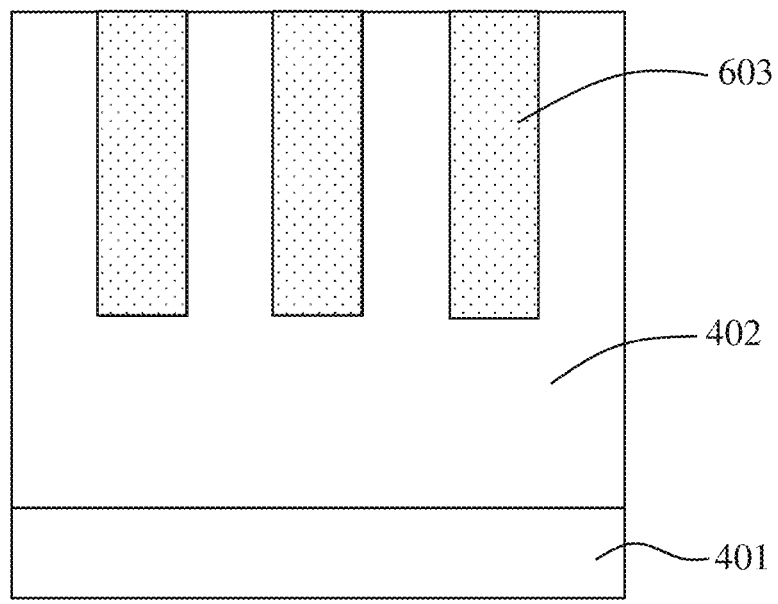
FIG. 10 is a cross sectional view of the substrate of the semiconductor device of FIG. 9 after the conductive material is planarized to form conductive lines according to some embodiments.

FIGS. 7 to 10 illustrates a cross-sectional view of a substrate 402 to provide a fully self-aligned via or air gap according to some embodiments. Referring to FIG. 10, a lower metallization layer (Mx) comprises a set of conductive lines 603 that extend along an axis on an insulating layer 402 on a substrate 401. The method may begin with FIGS. 7 and 8, where trenches 404 are formed in an insulating layer 402. Referring to FIG. 5, conductive layer 503 are deposited in trenches 404. Referring to FIG. 6, if necessary, the first conductive layer 403 are planarized to the surface of the insulating layer 402.

Figure 7:
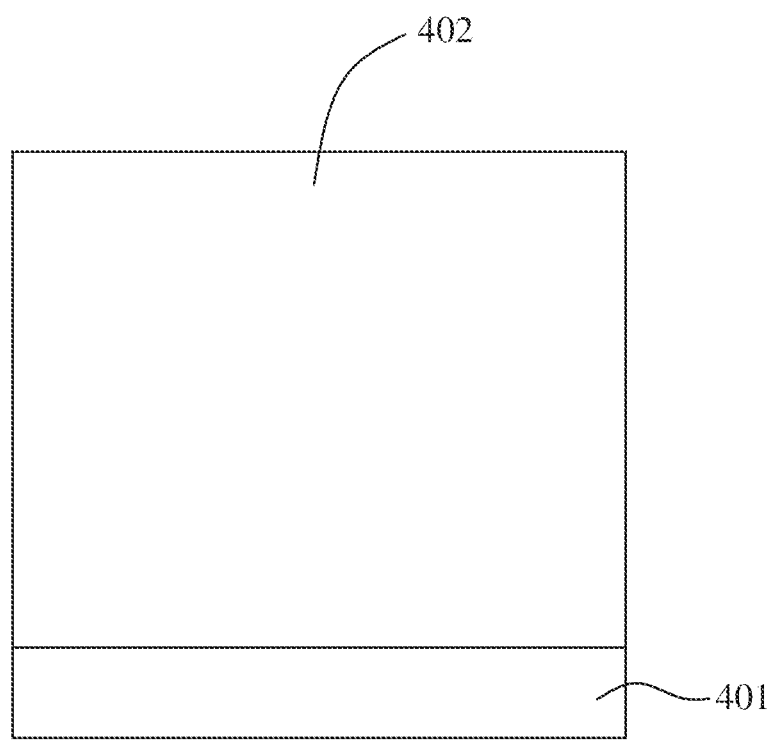
FIG. 7 is a cross sectional view of a substrate of a semiconductor device according to some embodiments.

Please refer to FIG. 7, at step S11, a first insulating layer 402 is formed on a substrate 401. In some embodiments, the substrate 401 comprises a semiconductor material, e.g., silicon (Si), carbon (C), germanium (Ge), silicon germanium (SiGe), gallium arsenide (GaAs), InP, GaAs, InGaAs, InAlAs, other semiconductor material, or any combination thereof. In some embodiments, substrate 401 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 401 can be, for example, an organic, a ceramic, a glass, or a semiconductor substrate. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, substrate 401 includes one or more metallization interconnect layers for integrated circuits. In some embodiments, the substrate 401 includes interconnects, for example, vias, configured to connect the metallization layers. In some embodiments, the substrate 401 includes electronic devices, e.g., transistors, memories, capacitors, resistors, optoelectronic devices, switches, and any other active and passive electronic devices that are separated by an electrically insulating layer. For example, an interlayer dielectric, a trench insulation layer or any other insulating layer known to one of ordinary skill in the art of the electronic device manufacturing. In some embodiments, the substrate includes one or more buffer layers to accommodate for a lattice mismatch between the substrate 401 and one or more layers above substrate 401 and to confine lattice dislocations and defects.

The first insulating layer 402 can be any material suitable to insulate adjacent devices and prevent leakage. In some embodiments, electrically insulating layer 402 is an oxide layer, e.g., silicon dioxide, or any other electrically insulating layer determined by an electronic device design. In some embodiments, the first insulating layer 402 comprises an interlayer dielectric (ILD). In some embodiments, the first insulating layer 402 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride or any combination thereof.

In some embodiments, the first insulating layer 402 includes a dielectric material having k-value less than 5. In some embodiments, the first insulating layer 402 includes a dielectric material having k-value less than 2. In some embodiments, the first insulating layer 402 includes a nitride, oxide, a polymer, phosphosilicate glass, fluorosilicate (SiOF) glass, organosilicate glass (SiOCH), other electrically insulating layer determined by an electronic device design, or any combination thereof. In some embodiments, the first insulating layer 402 may include polyimide, epoxy, photodefinable materials, such as benzocyclobutene (BCB), and WPR-series materials, or spin-on-glass.

In some embodiments, the first insulating layer 402 is a low-k interlayer dielectric to isolate one metal line from other metal lines on the substrate 401. In some embodiments, the thickness of the first insulating layer 402 is in an approximate range from about 10 nanometers (nm) to about 2 microns (µm).

In some embodiments, the first insulating layer 402 is deposited using one of deposition techniques, such as but not limited to a chemical vapor deposition (CVD), a physical vapor deposition (PVD), molecular beam epitaxy (MBE), metal-organic chemical vapor deposition (MOCVD), atomic layer deposition (ALD), spin-on, or other insulating deposition techniques known to one of ordinary skill in the art of microelectronic device manufacturing.

In some embodiments, the composition of the first insulating layer 402 is analogous to the second material 120 described above.

Please refer to FIG. 8, at step S13, a plurality of recesses 404 is formed in the first insulating layer 402. In some embodiments, the first insulating layer 402 is patterned and etched using a hard mask to form recesses 404 using one or more patterning and etching techniques known to one of ordinary skill in the art of microelectronic device manufacturing. In some embodiments, the size of recesses 404 in the first insulating layer 402 is determined by the size of conductive lines 603 formed later on in a process.

Figure 11:
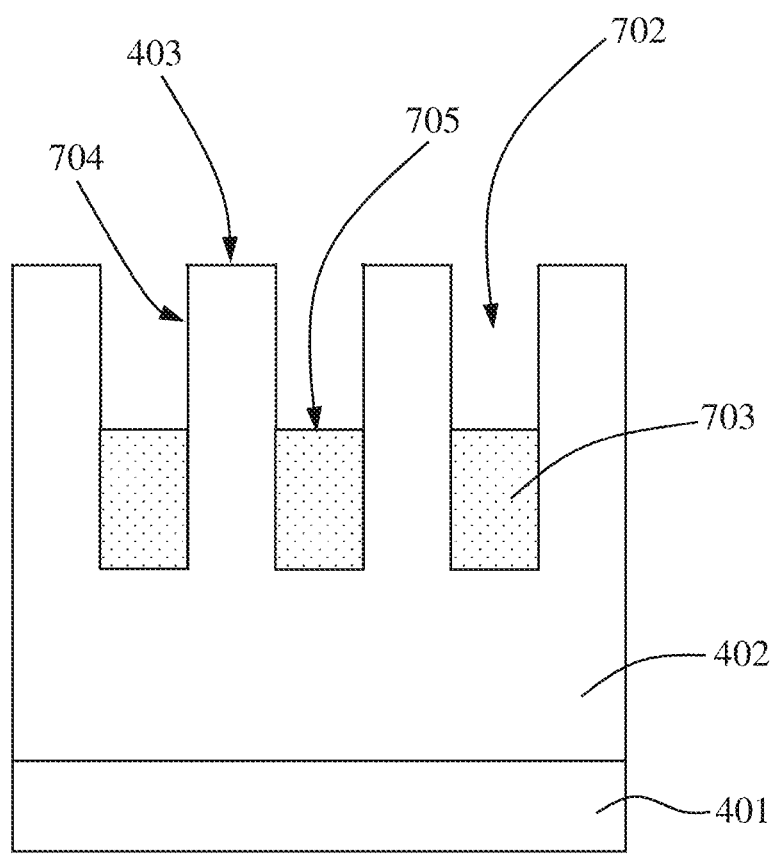
FIG. 11 is a cross sectional view of the substrate of the semiconductor device of FIG. 10 after the conductive lines are recessed according to some embodiments.

Please refer to FIGS. 9, 10 and 11, at step S15, a conductive line 703 is formed in the at least one recess 404. In some embodiments, the lower metallization layer Mx comprising conductive lines 603 is a part of a back end metallization of the electronic device. Please refer to FIG. 9, a conductive layer 503 is deposited in the recesses 404. In some embodiments, forming the conductive lines 603 involves filling the recesses 404 with a layer of conductive material. In some embodiments, a base layer (not shown) is first deposited on the internal sidewalls and bottom of the recesses 404, and then the conductive layer 503 is deposited on the base layer. In some embodiments, the base layer includes a conductive seed layer (not shown) deposited on a conductive barrier layer (not shown). The seed layer can include copper, and the conductive barrier layer can include aluminum, titanium, tantalum, tantalum nitride, and the like metals. The conductive barrier layer can be used to prevent diffusion of the conductive material from the seed layer, e.g., copper, into the first insulating layer 402. Additionally, the conductive barrier layer can be used to provide adhesion for the seed layer (e.g., copper).

In some embodiments, to form the base layer, the conductive barrier layer is deposited onto the sidewalls and bottom of the recesses 404, and then the seed layer is deposited on the conductive barrier layer. In another embodiment, the conductive base layer includes the seed layer that is directly deposited onto the sidewalls and bottom of the recesses 404. Each of the conductive barrier layer and seed layer may be deposited using any thin film deposition technique known to one of ordinary skill in the art of semiconductor manufacturing, e.g., sputtering, blanket deposition, and the like. In one embodiment, each of the conductive barrier layer and the seed layer has the thickness in an approximate range from about 1 nm to about 100 nm. In some embodiments, the barrier layer may be a thin dielectric that has been etched to establish conductivity to the metal layer below. In some embodiments, the barrier layer may be omitted altogether and appropriate doping of the copper line may be used to make a "self-forming barrier".

In some embodiments, the conductive layer 503 e.g., copper, is deposited onto the seed layer of base layer of copper, by an electroplating process. In some embodiments, the conductive layer is deposited into the recesses 404 using a damascene process known to one of ordinary skill in the art of microelectronic device manufacturing. In one embodiment, the conductive layer 503 is deposited onto the seed layer in the recesses 404 using a selective deposition technique, such as but not limited to electroplating, electroless, a CVD, PVD, MBE, MOCVD, ALD, spin-on, or other deposition techniques known to one of ordinary skill in the art of microelectronic device manufacturing.

In some embodiments, the choice of a material for conductive layer 503 for the conductive lines 603 determined the choice of a material for the seed layer. For example, if the material for the conductive lines 603 includes copper, the material for the seed layer also includes copper. In some embodiments, the conductive lines 603 include a metal, for example, copper (Cu), ruthenium (Ru), nickel (Ni), cobalt (Co), chromium (Cr), iron (Fe), manganese (Mn), titanium (Ti), aluminum (Al), hafnium (Hi), tantalum (Ta), tungsten (W), Vanadium (V), Molybdenum (Mo), palladium (Pd), gold (Au), silver (Au), platinum PI, indium (In), tin (Sn), lead (Pb), antimony (Sb), bismuth (Bi), zinc (Zn), cadmium (Cd), or any combination thereof.

In alternative embodiments, examples of the conductive materials that may be used for the conductive lines 603 of the metallization layer Mx are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In some embodiments, the composition of the conductive lines is analogous to the first material 110 described above.

Referring to FIG. 10, the conductive layer 503 is planarized to a surface 403 of the first insulating layer 402 (to form the conductive lines 603). In some embodiments, portions of the conductive layer 503 are removed to even out top portions of the conductive lines 603 with top portions of the first insulating layer 402 using a chemical-mechanical polishing (CMP) technique known to one of ordinary skill in the art of microelectronic device manufacturing.

In one non-limiting example, the thickness of the conductive lines 603 is in an approximate range from about 15 nm to about 1000 nm. In one non-limiting example, the thickness of the conductive lines 603 is from about 20 nm to about 200 nm. In one non-limiting example, the width of the conductive lines 603 is in an approximate range from about 5 nm to about 500 nm. In one non-limiting example, the spacing (pitch) between the conductive lines 603 is from about 2 nm to about 500 nm. In more specific non-limiting example, the spacing (pitch) between the conductive lines 603 is from about 5 nm to about 50 nm.

In some embodiments, the lower metallization layer Mx is configured to connect to other metallization layers (not shown). In some embodiments, the metallization layer Mx is configured to provide electrical contact to electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of electronic device manufacturing.

Please refer to FIG. 11, the conductive layer (e.g. the conductive lines 603) is recessed to be lower than the surface 403 of the first insulating layer 402 to form the conductive line (the recessed conductive lines 703). That is, the conductive lines 603 are recessed to a predetermined depth to form recessed conductive lines 703. As shown in FIG. 11, trenches 702 are formed in the first insulating layer 402. Each trench 702 has sidewalls 704 that are portions of first insulating layer 402 and a bottom that is a top surface 705 of the recessed conductive line 603.

In some embodiments, the depth of the trenches 702 is from about 10 nm to about 500 nm. In some embodiments, the depth of the trenches 702 is from about 10% to about 100% of the thicknesses of the conductive lines. In some embodiments, the conductive lines 603 are recessed using one or more of wet etching, dry etching, or a combination of techniques known to one of ordinary skill in the art of electronic device manufacturing.

Figure 12:
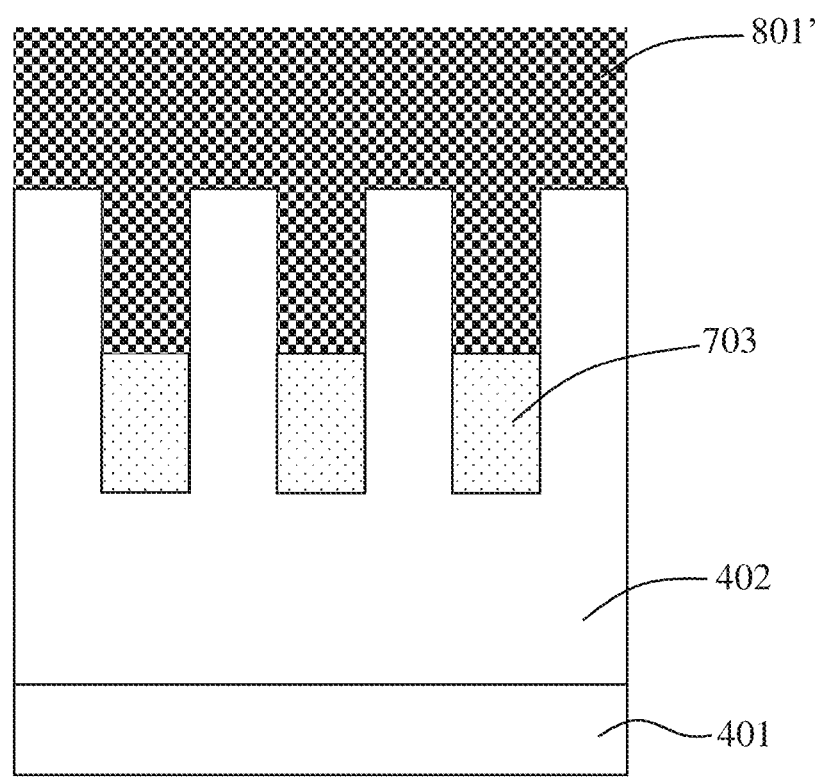
FIGS. 12 and 13 are cross sectional view of the substrate of the semiconductor device of FIG. 11 after carbon pillars are formed on the conductive lines according to some embodiments.
Figure 13:
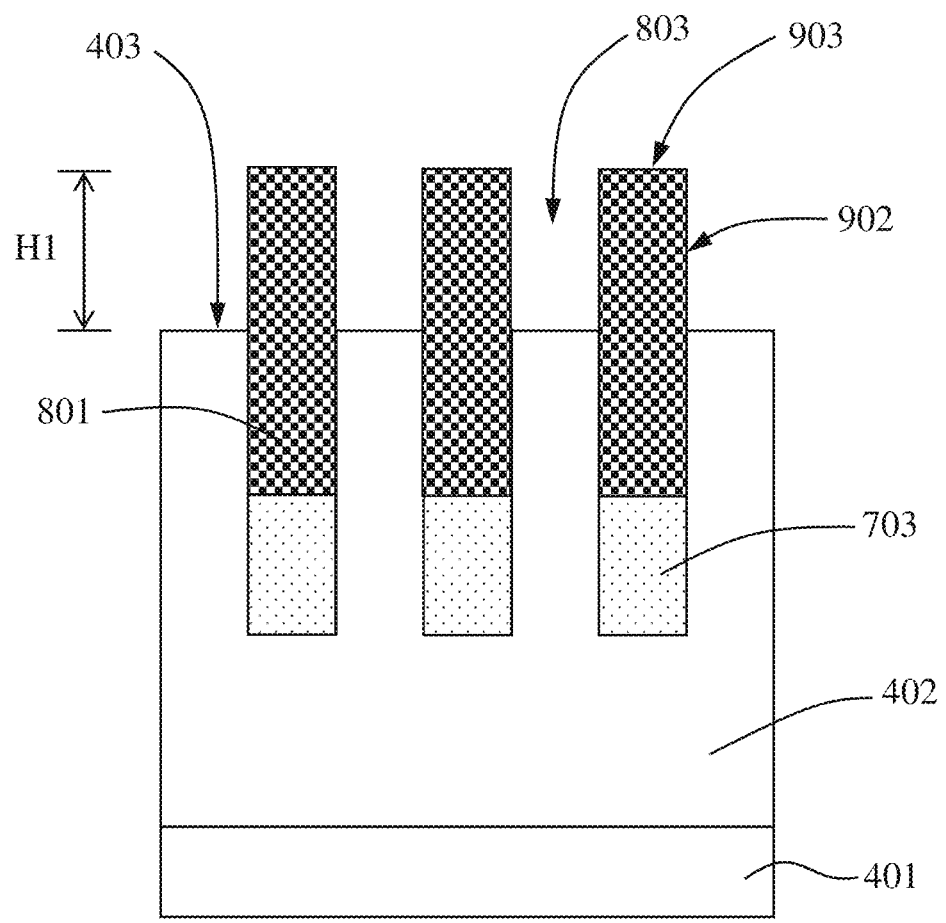

Please refer to FIGS. 12 and 13, at step S17, a self-aligned selective growth pillar 801 is formed over the (recessed) conductive line 703. Please refer to FIG. 12, in some embodiments, the first insulating layer 402 is exposed to a carbon precursor 801' before the step S17. The self-aligned selective growth pillars 801 may be formed according to methods described herein for forming carbon pillars 330. As shown in FIGS. 12 and 13, an array of the self-aligned selective growth pillars 801 has the same pattern as the set of the recessed conductive lines 703. In some embodiments, the self-aligned selective growth pillars 801 extend substantially orthogonally from top surfaces 705 of the recessed conductive lines 703. As shown in FIG. 13, the self-aligned selective growth pillars 801 extend substantially orthogonally from the top surfaces of the recessed conductive lines 703. As shown in FIG. 13, the self-aligned selective growth pillars 801 extend along the same direction as the conductive lines 603. As shown in FIG. 13, the self-aligned selective growth pillars 801 are separated by gaps 803. In some embodiments, a height H1 of the self-aligned selective growth pillars 801 is in an approximate range from about 5 angstroms (Å) to about 10 microns (μm).

Figure 14:
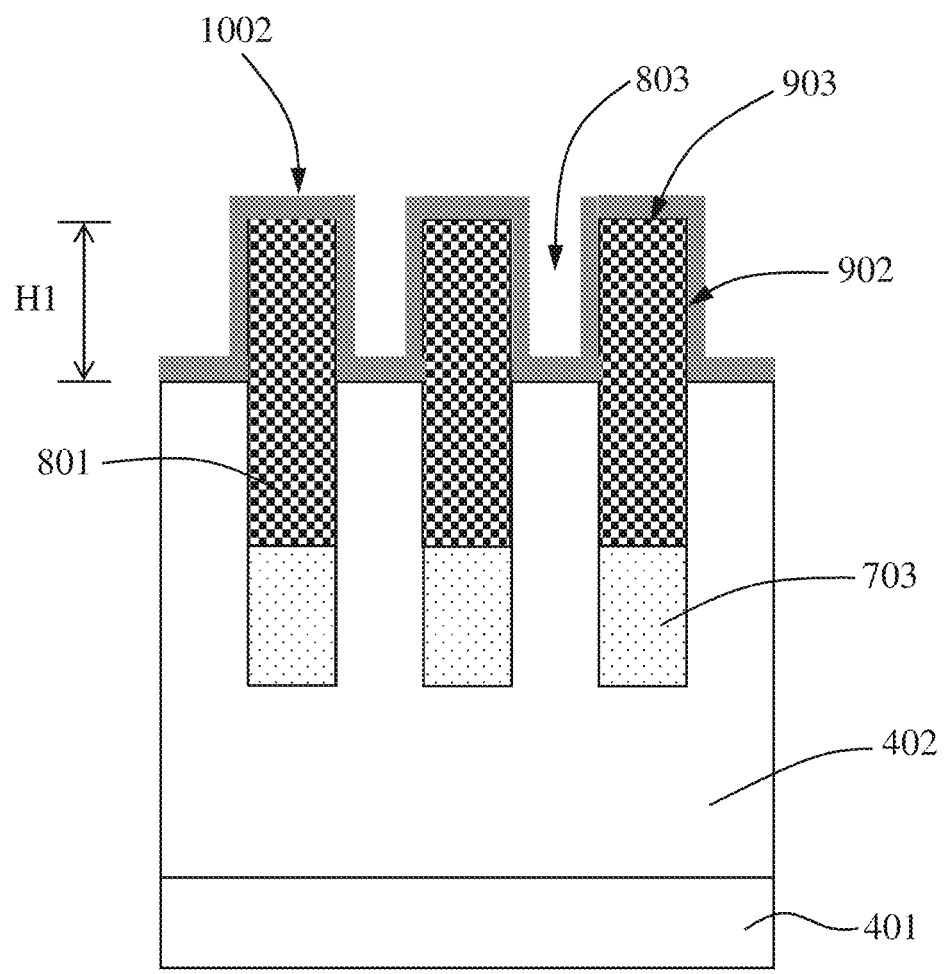
FIGS. 14 and 15 are cross sectional view of the substrate of the semiconductor device of FIG. 13 after forming spacers on sidewalls of the carbon pillars.
Figure 15:
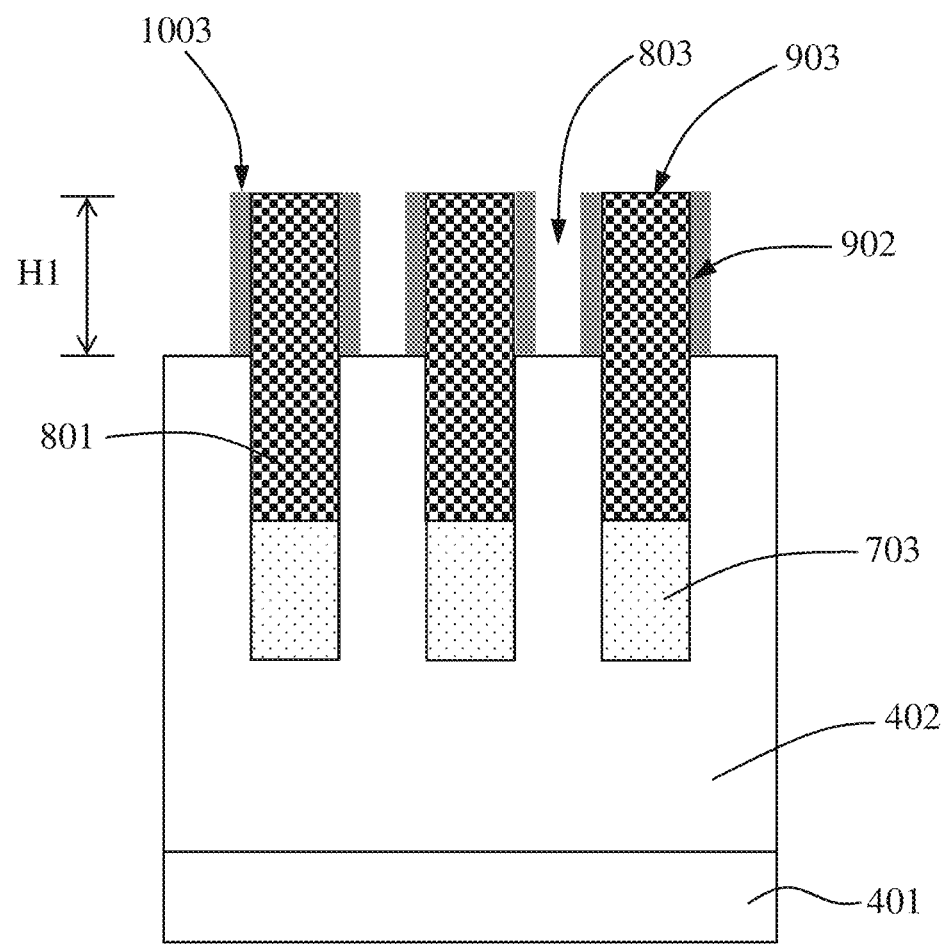

Please refer to FIGS. 14 and 15, at step S19, spacers 1003 are selectively formed on sidewalls 902 of the self-aligned selective growth pillars 801. Please refer to FIG. 14, a conductive layer 1002 is deposited on the surface 403 of the first insulating layer 402, the top 903 of the self-aligned selective growth pillar(s) 801 and sidewalls 902 of the self-aligned selective growth pillar(s) 801. And then, please refer to FIG. 15, the conductive layer 1002 on the surface 403 of the first insulating layer 402 and the top 903 of the self-aligned selective growth pillar(s) 801 are removed. In some embodiments, the step of removing the conductive layer 1002 on the surface 403 of first insulating layer 402 and the top 903 of the self-aligned selective growth pillar(s) 801 is performed by a spacer etching process.

Figure 16:
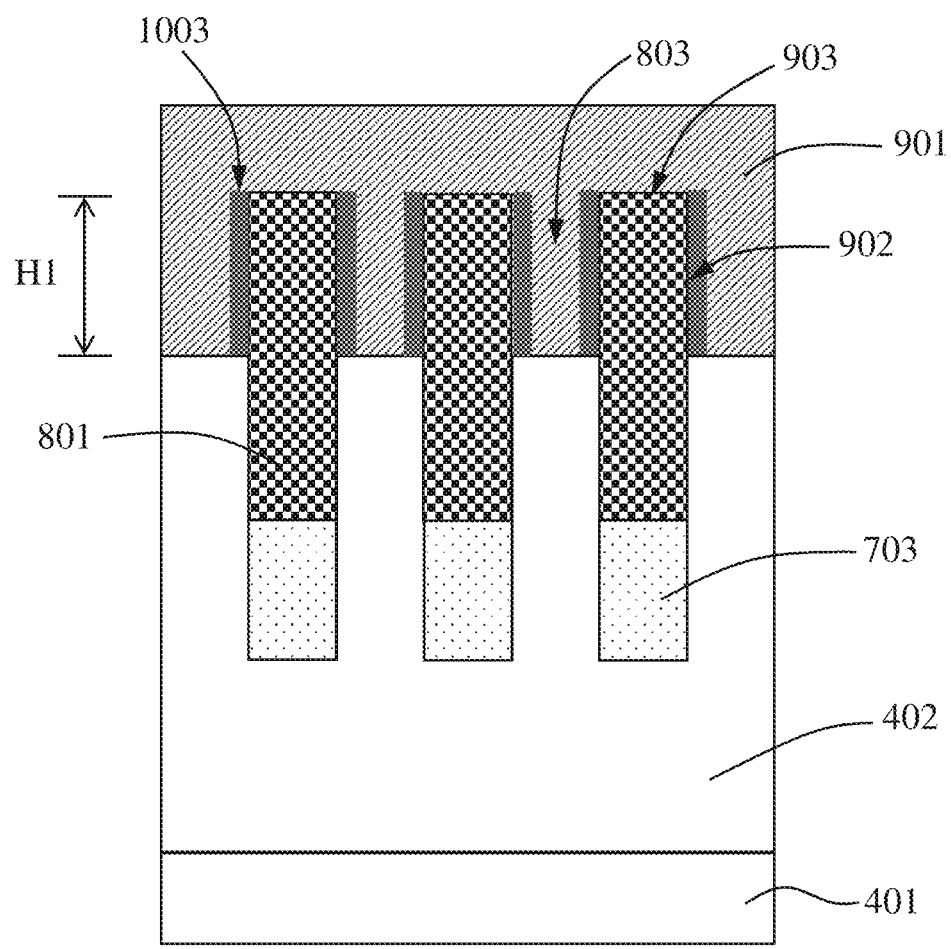
FIG. 16 is a cross sectional view of the substrate of the semiconductor device of FIG. 15 after a second insulating material is deposited around the carbon pillars according to some embodiments.

Please refer to FIG. 16, at step S21, a second insulating layer 901 is deposited to overfill gaps 803 between the two adjacent self-aligned selective growth pillars 801. In some embodiments, the self-aligned selective growth pillars 801 are separated by the gaps 803 after the step S19. As shown in FIG. 16, the second insulating layer 901 is deposited on the spacers 1003 formed at sidewalls 902 of the self-aligned selective growth pillar(s) 801, the tops 903 of the self-aligned selective growth pillar(s) 801 and through the gaps 803 on the portions of the insulating layer 402 between the self-aligned selective growth pillars 801.

In some embodiments, the second insulating layer 901 is a low-k gap-fill layer. In one embodiment, the second insulating layer 901 is a flowable silicon oxide (FSiOx) layer. In some embodiments, the second insulating layer 901 is an oxide layer, e.g., silicon dioxide, or any other electrically insulating layer determined by an electronic device design. In some embodiments, the second insulating layer 901 is an interlayer dielectric (ILD). In some embodiments, the second insulating layer 901 is a low-k dielectric that includes, but is not limited to, materials such as, e.g., silicon dioxide, silicon oxide, a carbon based material, e.g., a porous carbon film, carbon doped oxide (CDO), e.g., carbon doped silicon dioxide, porous silicon dioxide, porous silicon oxide carbide hydride (SiOCH), silicon nitride, or any combination thereof. In some embodiments, the second insulating layer 901 is a dielectric material having k-value less than 3. In some embodiments, the second insulating layer 901 is a dielectric material having k-value in an approximate range from about 2.2 to about 2.7. In some embodiments, the second insulating layer 901 includes a dielectric material having k-value less than 2. In some embodiments, the second insulating layer 901 represents one of the insulating layers described above with respect to the first insulating layer 402.

In some embodiments, the second insulating layer 901 is a low-k interlayer dielectric to isolate one metal line from other metal lines. In some embodiments, the second insulating layer 901 is deposited using one of deposition techniques, such as but not limited to a CVD, spin-on, an ALD, PVD, MBE, MOCVD, or other low-k insulating layer deposition techniques known to one of ordinary skill in the art of microelectronic device manufacturing.

Figure 17:
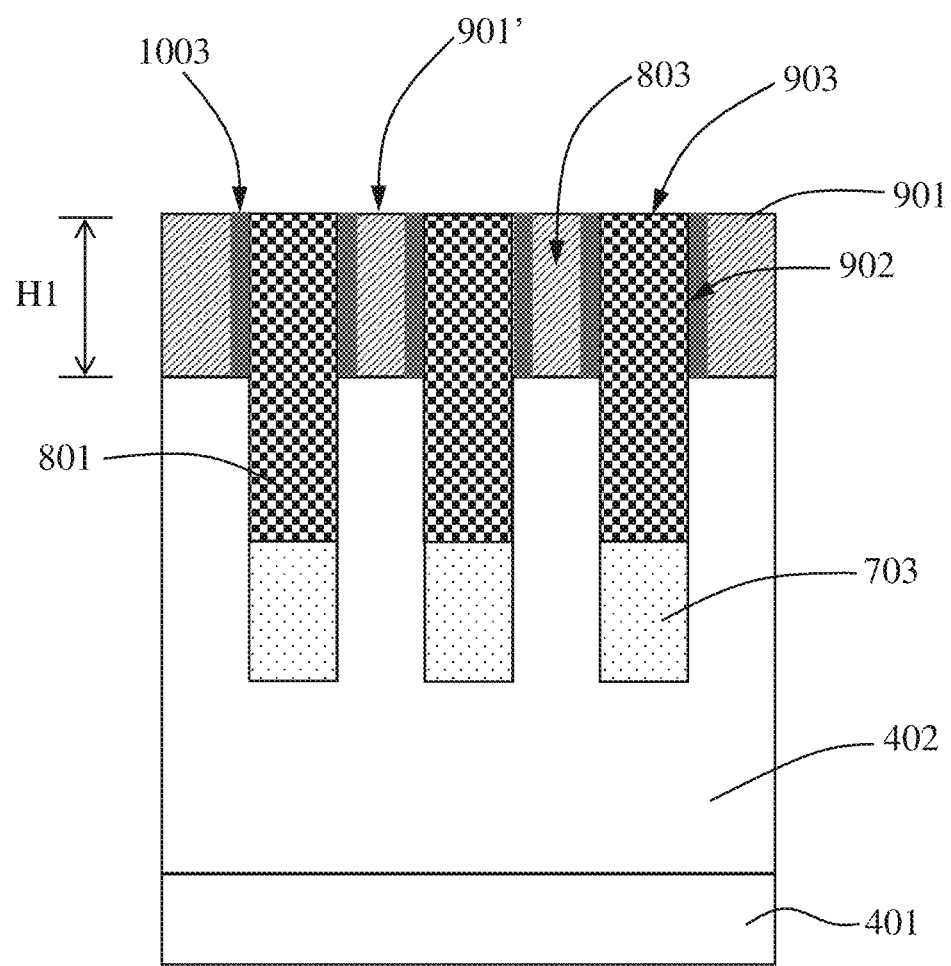
FIG. 17 is a cross sectional view of the substrate of the semiconductor device of FIG. 16 after the second insulating material is planarized according to some embodiments.

Please refer to FIG. 17, at step S23, the second insulating layer 901 over the self-aligned selective growth pillars 801 is removed. In some embodiments, the second insulating layer 901 is performed by chemical-mechanical planarization (CMP) to expose the tops 903 of the self-aligned selective growth pillars 801. The CMP process can be any suitable planarization process known to those skilled in the art. In some embodiments, the second insulating layer 901 is deposited so that the top of the second insulating layer 901 is even with or slightly below the top 903 of the self-aligned selective growth pillars 801 and the CMP process is not performed.

Figure 18:
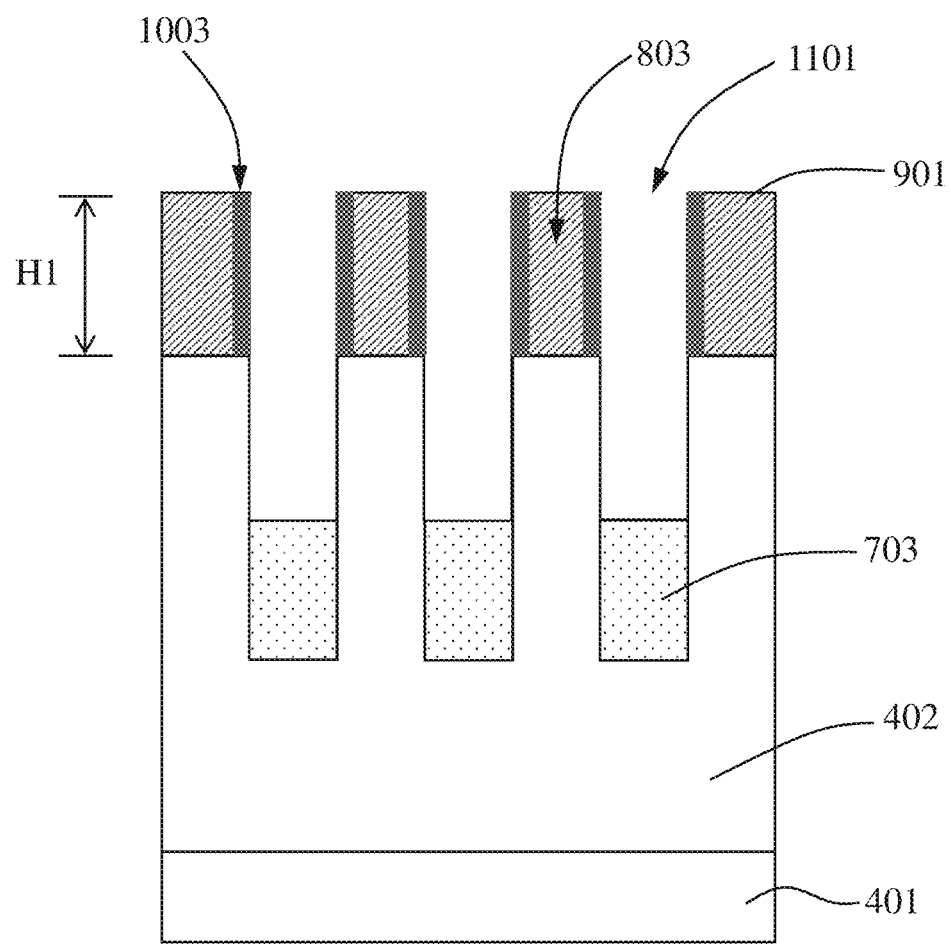
FIG. 18 is a cross sectional view of the substrate of the semiconductor device of FIG. 17 after the carbon pillars are removed to form trenches according to some embodiments.

Please refer to FIG. 18, at step S25, the self-aligned selective growth pillars 801 are removed to form trenches 1101. Etching process can be performed in this part of the process, or any other part of the process incorporating an etch, by any suitable etch technique known to those skilled in the art. In some embodiments, the etching process is one or more of a dry etch or wet etch.

Figure 19:
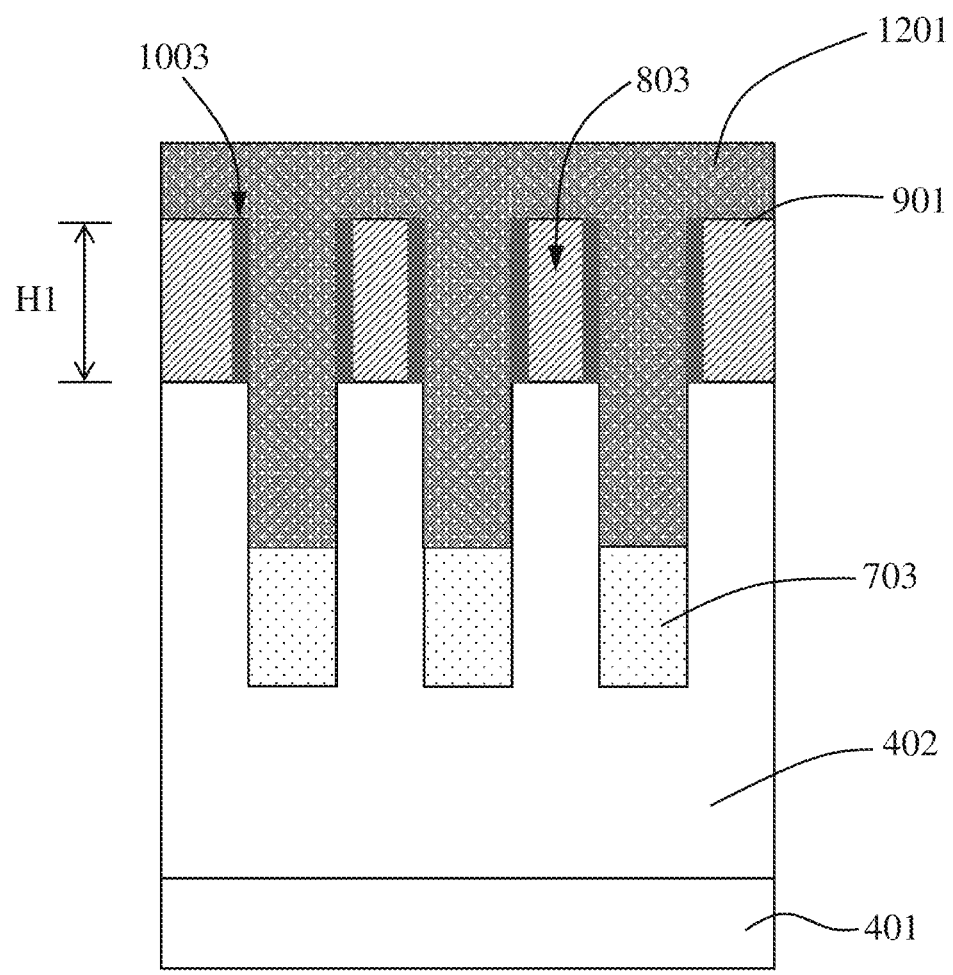
FIG. 19 is cross sectional view of the substrate of the semiconductor device of FIG. 18 after depositing a conductive material in the trenches according to some embodiments.
Figure 20:
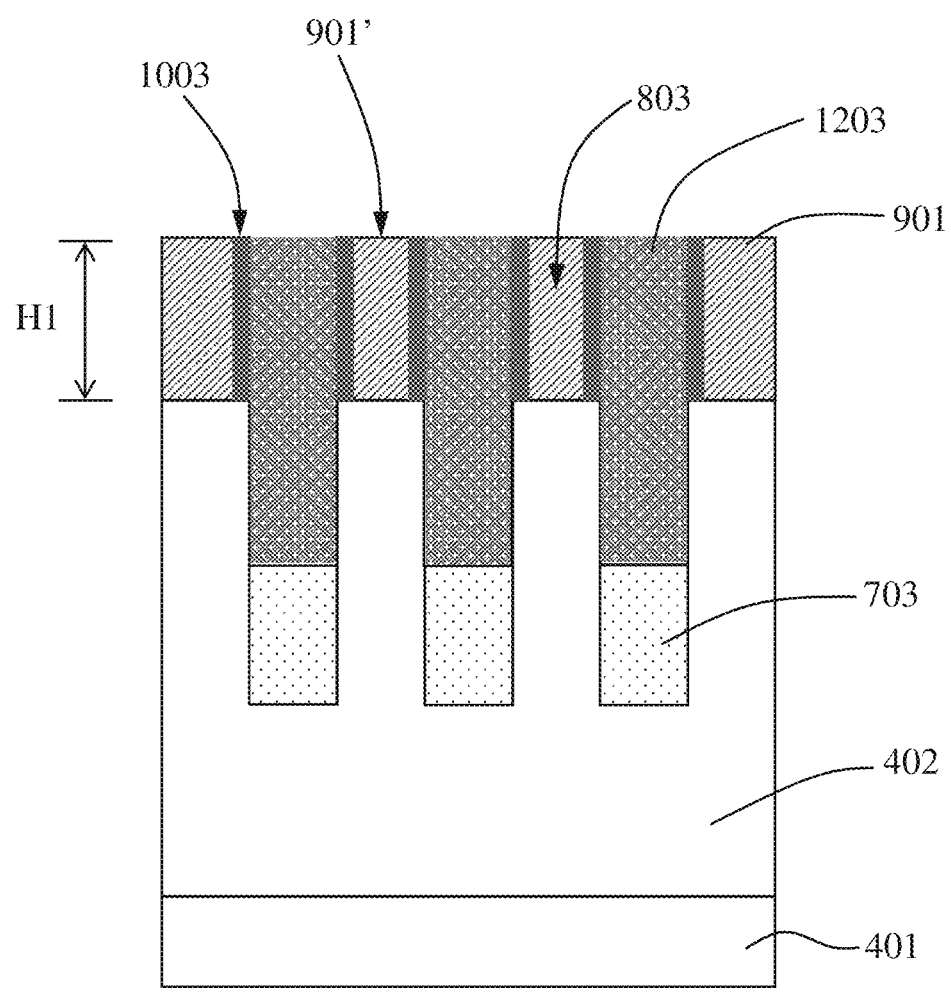
FIG. 20 is cross sectional view of the substrate of the semiconductor device of FIG. 19 after the conductive material is planarized to form a landing pad with the conductive spacers.

Please refer to FIG. 19, at step S27, a conductive material 1201 is deposited in the trenches 1101. Please refer to FIG. 20, after the step S27, the conductive material. 1201 is planarized to a top 901' (shown as in FIG. 17) of the second insulating layer 901 to form a conductive pillar 1203. That is, a landing pad (the conductive pillar 1203) is formed with conductive spacers 1003.

Due to the design of the semiconductor device of the present disclosure, a landing pad (the conductive pillar 1203) is formed with the conductive spacers 1003. Therefore, the stringer and the bridge phenomenon resulting from the limitation of the design rule may be restrained.

One aspect of the present disclosure provides a semiconductor device including a substrate, an insulating layer, a conductive pillar and spacers. The insulating layer is disposed above the substrate. The conductive pillar is disposed in the substrate and penetrates through the insulating layer. The spacers are disposed on sidewalls of the conductive pillar.

Another aspect of the present disclosure provides a method for fabricating a semiconductor device including providing a substrate; forming a plurality of recesses in the substrate; forming a conductive line in the at least one recess; forming a self-aligned selective growth pillar over the conductive line; selective forming spacers on sidewalls of the self-aligned selective growth pillars; depositing an insulating layer to overfill gaps between the two adjacent self-aligned selective growth pillars; removing the insulating layer over the self-aligned selective growth pillars; removing the self-aligned selective growth pillars to form trenches; and depositing a conductive material in the trenches.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method of forming a semiconductor device, comprising:
    forming a first insulating layer on a substrate;
    forming a plurality of recesses in the first insulating layer;
    forming a conductive line in at least one recess of the plurality of recesses;
    forming a plurality of self-aligned selective growth pillars over the conductive line;
    selective forming spacers on sidewalls of the plurality of self-aligned selective growth pillars;
    depositing a second insulating layer to overfill gaps between two adjacent self-aligned selective growth pillars of the plurality of self-aligned growth pillars;
    removing the second insulating layer over the plurality of self-aligned selective growth pillars;
    removing the plurality of self-aligned selective growth pillars to form trenches; and
    depositing a conductive material in the trenches.

2. The method for fabricating the semiconductor device of claim 1, wherein the step of forming a plurality of recesses in the first insulating layer is performed by an etching process.

3. The method for fabricating the semiconductor device of claim 1, wherein the step of forming the conductive line in the at least one recess, further comprising:
    depositing a conductive layer in the recesses;
    planarizing the conductive layer to a surface of the first insulating layer; and
    recessing the conductive layer to be lower than the surface of the first insulating layer to form the conductive line.

4. The method for fabricating the semiconductor device of claim 3, wherein in the step of forming the plurality of self-aligned selective growth pillars over the conductive line, a top of each of the self-aligned selective growth pillars is higher than the surface of the first insulating layer.

5. The method for fabricating the semiconductor device of claim 4, further comprising exposing the first insulating layer to a carbon precursor before the step of forming the plurality of self-aligned selective growth pillars over the conductive line.

6. The method for fabricating the semiconductor device of claim 4, wherein the step of selective forming the spacers on sidewalls of the plurality of self-aligned selective growth pillars, further comprising:
    depositing a conductive layer on the surface of the first insulating layer, the top of each of the plurality of self-aligned selective growth pillars and sidewalls of the plurality of self-aligned selective growth pillars; and
    removing the conductive layer on the surface of the first insulating layer and the top of each of the plurality of self-aligned selective growth pillars.

7. The method for fabricating the semiconductor device of claim 6, wherein the step of removing the conductive layer on the surface of first insulating layer and the top of each of the plurality of self-aligned selective growth pillar is performed by a spacer etching process.

8. The method for fabricating the semiconductor device of claim 6, wherein the plurality of self-aligned selective growth pillars are separated by the gaps after the step of selective forming spacers on sidewalls of the plurality of self-aligned selective growth pillars.

9. The method for fabricating the semiconductor device of claim 6, wherein the step of removing the insulating layer over the plurality of self-aligned selective growth pillars is performed by chemical-mechanical planarization.

10. The method for fabricating the semiconductor device of claim 6, wherein a top of the second insulating layer is even with or slightly below the top of each of the plurality of self-aligned selective growth pillars after the step of removing the second insulating layer over the plurality of self-aligned selective growth pillars.

11. The method for fabricating the semiconductor device of claim 10, wherein the step of removing the plurality of self-aligned selective growth pillars to form trenches is performed by an etching process.

12. The method for fabricating the semiconductor device of claim 11, wherein the etching process is one or more of a dry etch or wet etch.

13. The method for fabricating the semiconductor device of claim 3, wherein a height between the top of each of the plurality of self-aligned selective growth pillars and the surface of the first insulating layer is in an approximate range from about 5 angstroms to about 10 microns.

14. The method for fabricating the semiconductor device of claim 3, wherein the plurality of self-aligned selective growth pillars extend substantially orthogonally from top surfaces of the recessed conductive lines.

15. The method for fabricating the semiconductor device of claim 1, further comprising planarizing the conductive material to a top of the second insulating layer to form a conductive pillar after the step of depositing the conductive material in the trenches.

* * * * *